United States Patent
Hsu et al.

(10) Patent No.: US 9,276,164 B2
(45) Date of Patent: Mar. 1, 2016

(54) OPTOELECTRONIC DEVICE AND METHOD FOR MANUFACTURING THE SAME

(71) Applicant: Epistar corporation, Hsinchu (TW)

(72) Inventors: Tzu Chieh Hsu, Hsinchu (TW); Ching-Pei Lin, Hsinchu (TW); Yen Ming Hsu, Hsinchu (TW); Shou-Chin Wei, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/684,647

(22) Filed: Nov. 26, 2012

(65) Prior Publication Data

US 2014/0145224 A1 May 29, 2014

(51) Int. Cl.
*H01L 33/00* (2010.01)
*H01L 33/22* (2010.01)
*H01L 33/44* (2010.01)

(52) U.S. Cl.
CPC ............ *H01L 33/0062* (2013.01); *H01L 33/22* (2013.01); *H01L 33/44* (2013.01); *H01L 33/0079* (2013.01); *H01L 2933/0025* (2013.01); *H01L 2933/0091* (2013.01)

(58) Field of Classification Search
CPC ... H01L 33/58; H01L 31/0682; H01L 33/005; H01L 33/00; H01L 31/02363; H01L 33/22; H01L 33/0062; H01L 33/44; H01L 33/079
USPC ............ 257/13, 79, 81, 88, E31.13, E33.001, 257/E33.067, 93–104
See application file for complete search history.

(56) References Cited

U.S. PATENT DOCUMENTS

| | | | |
|---|---|---|---|
| 7,244,957 B2 | 7/2007 | Nakajo et al. | |
| 7,875,474 B2 * | 1/2011 | Muraki et al. | 438/29 |
| 2003/0178626 A1* | 9/2003 | Sugiyama | H01L 33/22 257/79 |
| 2006/0145170 A1* | 7/2006 | Cho | H01L 33/22 257/95 |
| 2006/0192212 A1* | 8/2006 | Song | H01L 33/16 257/79 |
| 2007/0221929 A1* | 9/2007 | Lee | H01L 33/22 257/79 |
| 2010/0006884 A1* | 1/2010 | Ou et al. | 257/98 |
| 2010/0047952 A1* | 2/2010 | Ohnuma et al. | 438/58 |
| 2010/0072501 A1* | 3/2010 | Wakai et al. | 257/98 |
| 2010/0084679 A1* | 4/2010 | Hsieh | H01L 33/22 257/98 |
| 2010/0117070 A1* | 5/2010 | Adekore | H01L 21/0237 257/43 |
| 2010/0213485 A1* | 8/2010 | McKenzie et al. | 257/98 |
| 2011/0073894 A1* | 3/2011 | Chu et al. | 257/98 |
| 2011/0156066 A1* | 6/2011 | Yao | H01L 33/10 257/89 |
| 2012/0049226 A1* | 3/2012 | Jeong | 257/98 |
| 2012/0164797 A1* | 6/2012 | Lowenthal | H01L 25/048 438/127 |
| 2014/0113120 A1* | 4/2014 | Thiel | 428/212 |

* cited by examiner

Primary Examiner — Yosef Gebreyesus
(74) Attorney, Agent, or Firm — Muncy, Geissler, Olds & Lowe, P.C.

(57) ABSTRACT

A method of fabricating an optoelectronic device, comprising: providing a first substrate; forming an epitaxial stack on the first substrate wherein the epitaxial stack comprising a first conductive-type semiconductor layer, an active layer and a second conductive-type semiconductor layer; etching an upper surface of the second conductive-type semiconductor layer and forming a first texture profile on the upper surface of the second conductive-type semiconductor layer; forming a passivation layer on the upper surface of the second conductive-type semiconductor layer; and etching an upper surface of the passivation layer forming a second texture profile on the upper surface of the passivation layer wherein the first texture profile is different from the second texture profile.

23 Claims, 16 Drawing Sheets

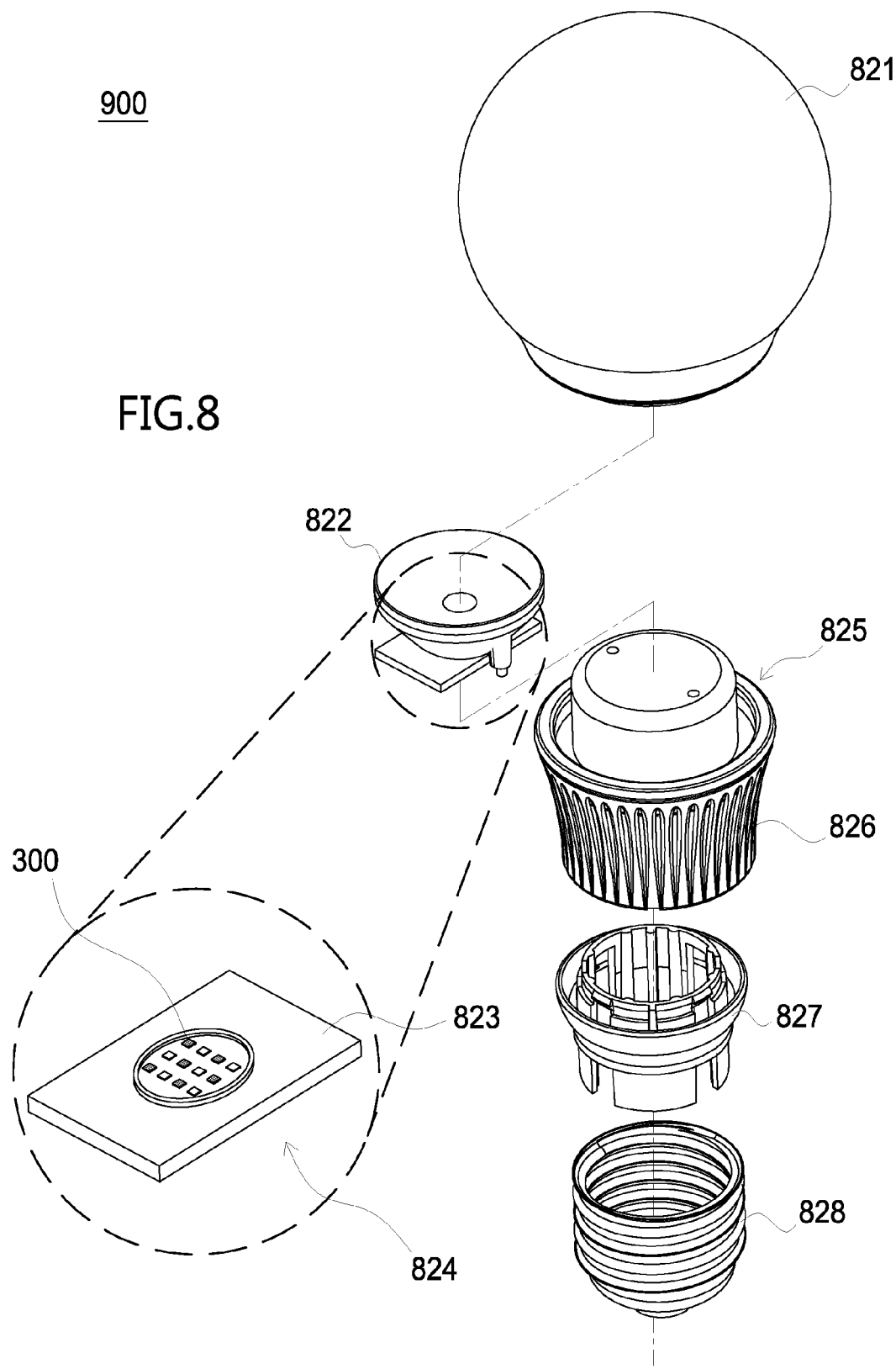

OPTOELECTRONIC DEVICE AND METHOD FOR MANUFACTURING THE SAME

BACKGROUND

1. Technical Field

The present disclosure disclosed an optoelectronic device which is especially related to the passivation layer of the optoelectronic device wherein at least one of the surfaces of the passivation layer is substantially textured. In addition, the disclosure also disclosed a method of fabricating the optoelectronic device.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as a new light source for the illumination markets. The LED applies to various applications like the traffic signal, backlight module, street light, and medical instruments, and is gradually replacing the traditional lighting sources.

FIG. 1 illustrates the structure of a conventional light emitting device 100 which includes a transparent substrate 10, a semiconductor stack layer 12 formed above the transparent substrate 10, and an electrode 14 formed above the semiconductor stack layer 12, wherein the semiconductor stack layer 12 comprises, from the top, a first conductive-type semiconductor layer 120, an active layer 122, and a second conductive-type semiconductor layer 124.

In addition, the light emitting device 100 can be further connected to other components in order to form a light emitting apparatus. FIG. 2 illustrates a conventional light emitting apparatus including a sub-mount 20 carrying an electrical circuit 202, a solder 22 formed above the sub-mount 20; wherein the light emitting device 100 is bonded to the sub-mount 20 and is electrically connected with the electric circuit 202 on the sub-mount 20 by the solder 22, and an electrical connection structure 24 that electrically connects the electrode 14 of the light emitting device 100 to the electric circuit 202 on the sub-mount 20. The sub-mount 20 may be a lead frame or a large size mounting substrate in order to facilitate circuit design and enhance heat dissipation.

Nevertheless, because the surface of the transparent substrate 10 of the conventional light emitting device 100 as shown in FIG. 1 is substantially flat and the refractive index of the transparent substrate 10 is different from the refractive index of the external environment, the total internal reflection (TIR) occurs when a light A emitted from the active layer 122. Therefore the light extraction efficiency from the light emitting device 100 is reduced drastically.

SUMMARY OF THE DISCLOSURE

A method of fabricating an optoelectronic device, comprising: providing a first substrate; forming an epitaxial stack on the first substrate wherein the epitaxial stack comprising a first conductive-type semiconductor layer, an active layer and a second conductive-type semiconductor layer; etching an upper surface of the second conductive-type semiconductor layer and forming a first texture profile on the upper surface of the second conductive-type semiconductor layer; forming a passivation layer on the upper surface of the second conductive-type semiconductor layer; and etching an upper surface of the passivation layer forming a second texture profile on the upper surface of the passivation layer wherein the first texture profile is different from the second texture profile.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

FIG. 8 is an explosive diagram of a bulb in accordance with an embodiment of the present application.

DETAILED DESCRIPTION OF THE PREFERRED EMBODIMENTS

Figure 1:
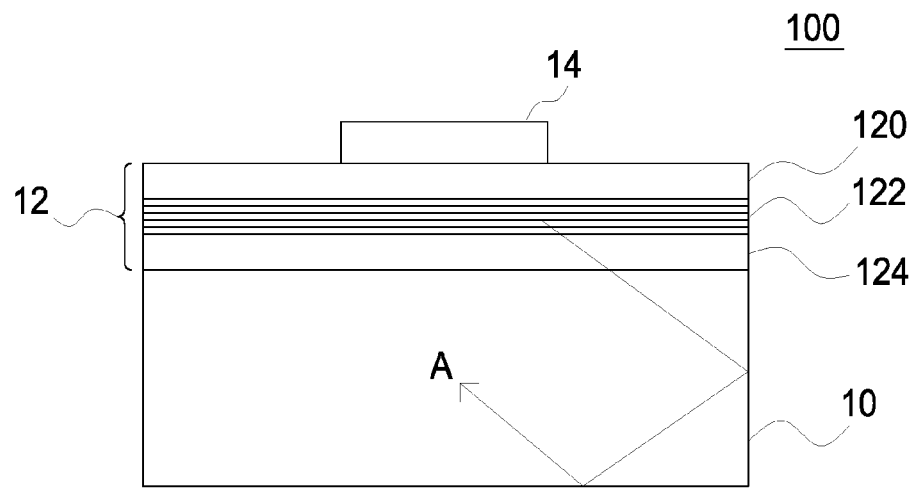
FIG. 1 illustrates the structure of a conventional light emitting device.
Figure 2:
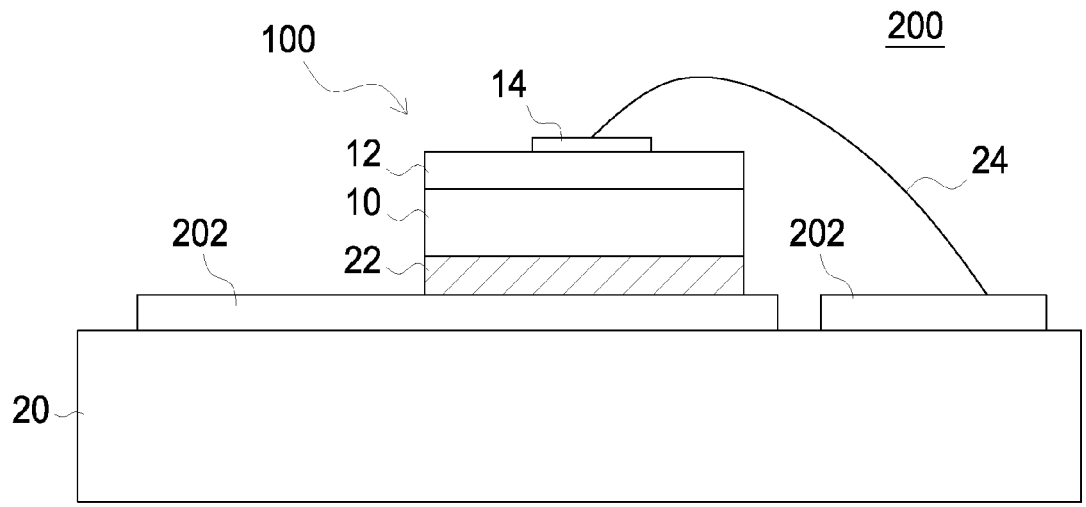
FIG. 2 illustrates the structure of a conventional light emitting apparatus.

Reference is made in detail to the preferred embodiments of the present application, examples of which are illustrated in the accompanying drawings. Wherever possible, the same reference numbers are used in the drawings and the description to refer to the same or like parts.

The present disclosure describes an optoelectronic device and a method of fabricating the optoelectronic device. In order to have a thorough understanding of the present disclosure, please refer to the following description and the illustrations of FIG. 3A to FIG. 8.

Figure 3A:
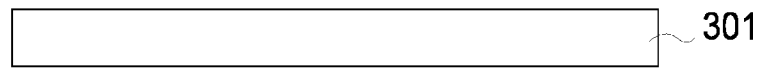
FIGS. 3A to 3M illustrate a process flow of a method of fabricating an optoelectronic device of a first embodiment of the present disclosure.
Figure 3B:

FIGS. 3A to 3M illustrate a process flow of the method of fabricating the optoelectronic device of a first embodiment of the present disclosure. FIGS. 3A-3B show a first substrate 301 and a semiconductor epitaxial layers formed on the first substrate 301, wherein the semiconductor epitaxial layer includes, from the bottom, a first conductive-type semiconductor layer 302, an active layer 303, and a second conductive-type semiconductor layer 304.

Figure 3C:
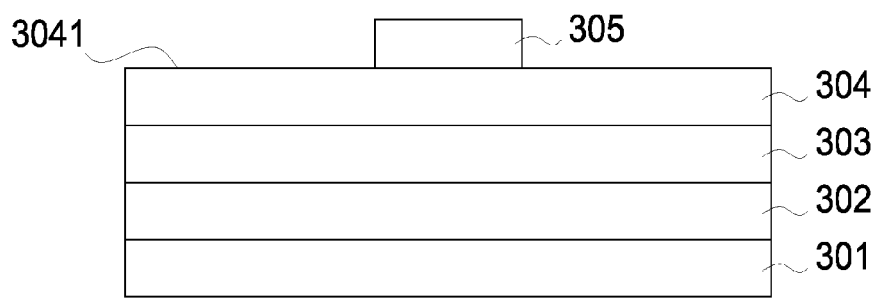
Figure 3D:
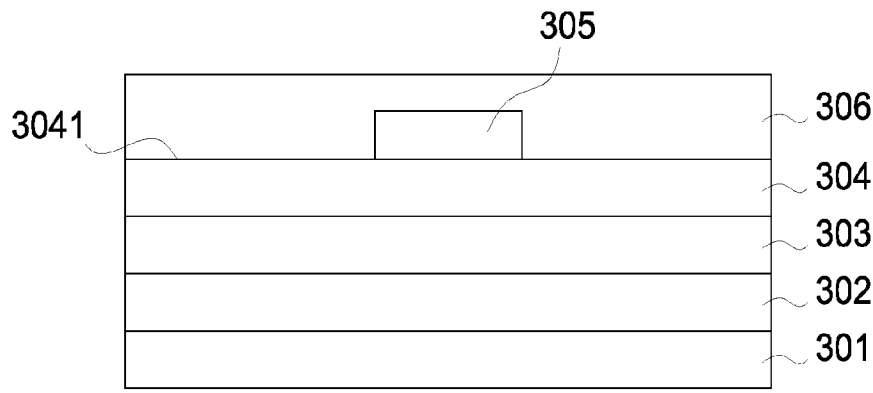

FIG. 3C shows at least one first electrode 305 is formed on the upper surface of second conductive-type semiconductor layer 3041. FIG. 3D shows a second substrate 306 is bonded on the upper surface of the second conductive-type semiconductor layer 3041 and covers the first electrode 305 and the exposed upper surface of the second conductive-type semiconductor layer 3041.

Figure 3E:
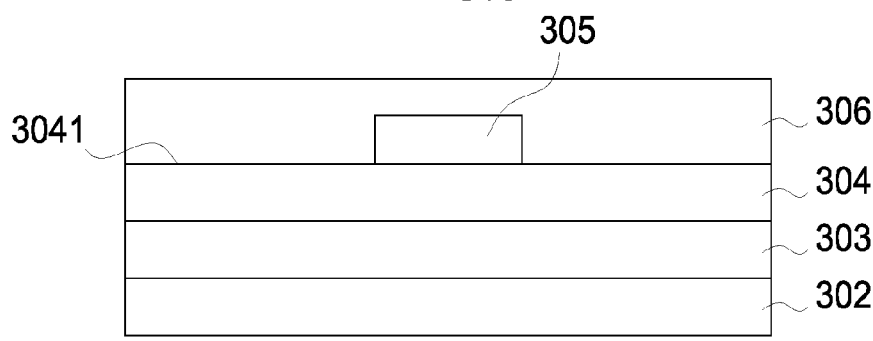
Figure 3F:
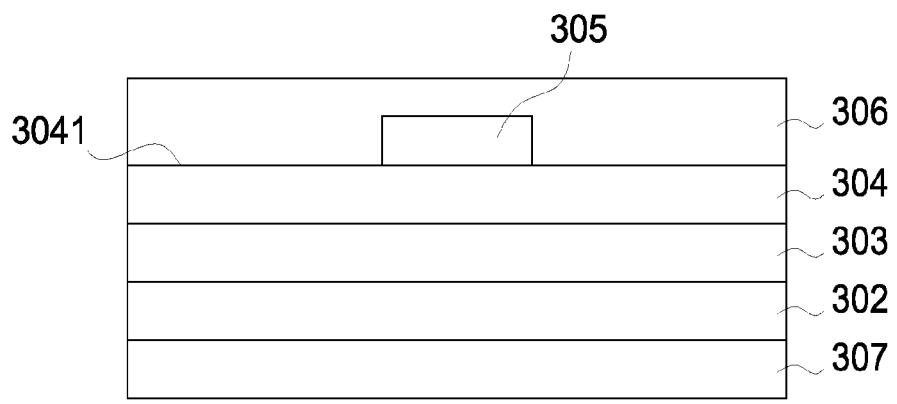

FIGS. 3E-3F show that the first substrate 301 is removed and one second electrode 307 is formed on the exposed first conductive-type semiconductor layer 302.

Figure 3G:
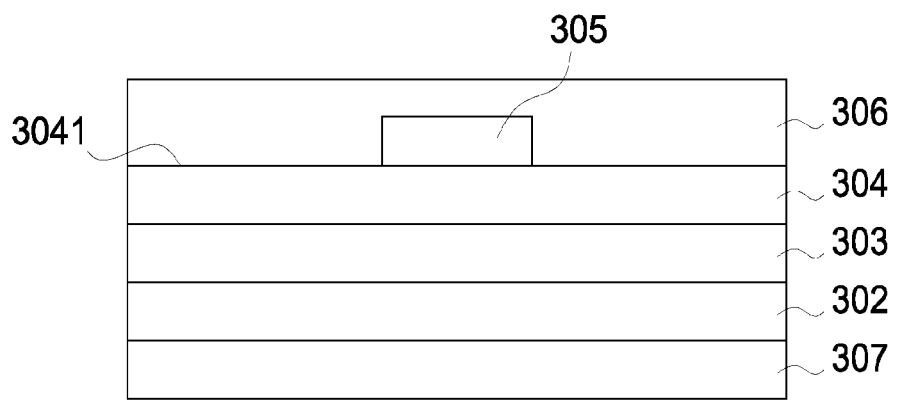
Figure 3G:
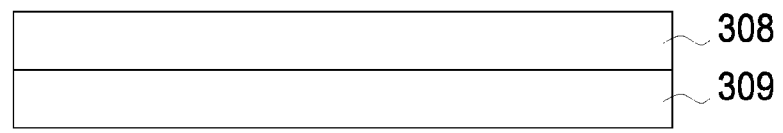
Figure 3H:
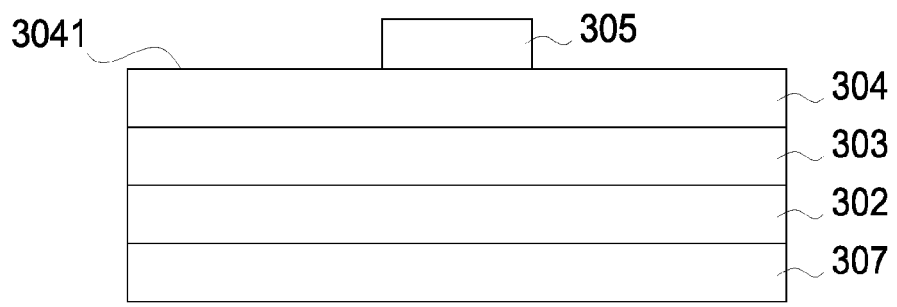
Figure 3H:
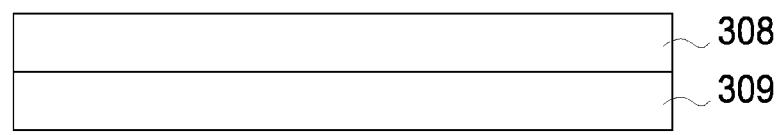

FIGS. 3G-3H show a third substrate 309 is provided and an adhesion layer 308 is formed on the third substrate 309. The adhesion layer 308 is then connected to the second electrode 307 with the opposite surface connected to the third substrate

309. After the connection of the third substrate 309 to the second electrode 307, the second substrate 306 is removed. In this embodiment, the material of the adhesion layer 308 comprises one material selected from the group consisting of polyimide (PI), benzocyclobutene (BCB), and perfluorocyclobutane (PFCB); or metal material.

In another embodiment, at least one transparent conductive layer (not shown), a current blocking layer (not shown) or a reflective layer (not shown) is selectively formed between the adhesion layer 308 and the second electrode 307.

Figure 3I:
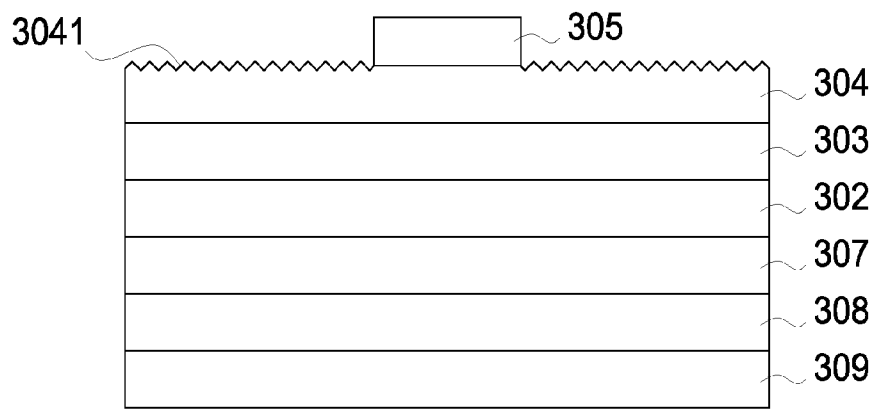

FIG. 3I shows etching the second conductive-type semiconductor layer 304 by the following method to form a first texture profile such as pore, void, pinhole, cavity or porous structure on the upper surface of the second conductive-type semiconductor layer 3041.

The methods include: 1) Wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture;

2) Electrochemical etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture; or 3) Dry etching such as inductive coupling plasma (ICP), reactive ion etch (RIE) by a gas containing at least one of HCl, $Cl_2$, $SF_6$, $BCl_3$ and $CH_4$.

However, the shape, density and/or depth of the first texture profile are adjustable by the method and conditions for formation. The shape of the first texture profile is adjustable by the etching conditions, and can form various types such as circle, hexagon, dodecagon, conical, or pyramidal shapes. For example, the depth of the first texture profile can be 200 nm-3000 nm, 500 nm-3000 nm, 1000 nm-3000 nm, 1500 nm-3000 nm, or 2000 nm-3000 nm.

Figure 3J:
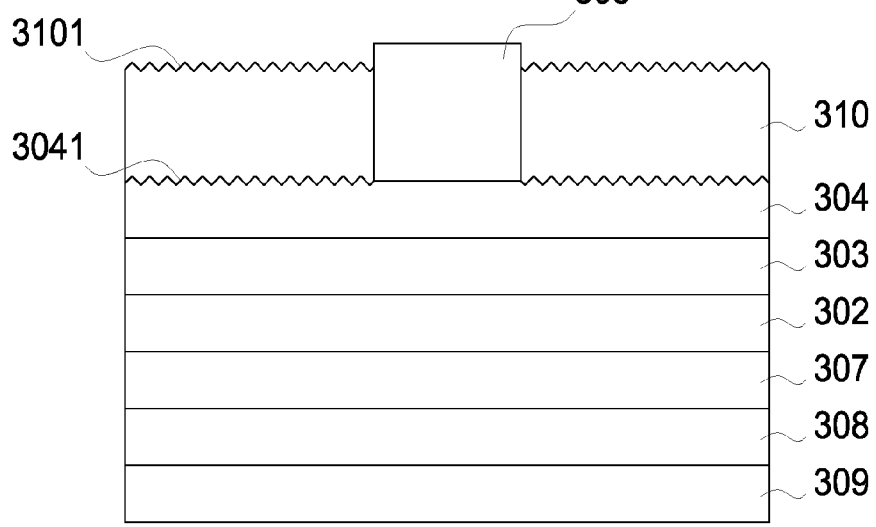

Following, as FIG. 3J shows, a passivation layer 310 is formed on the upper surface of the second conductive-type semiconductor layer 3041 and at least a second texture profile is formed on the upper surface of the passivation layer 3101 wherein the second texture profile is substantially the same with the first texture profile. The material of the passivation layer 310 can be $SiO_2$, $TiO_2$, $Ta_2O_5$ or $SiN_x$ and the thickness of the passivation layer 310 can be 200 nm-5000 nm, 500 nm-5000 nm, 1000 nm-5000 nm, 2000 nm-5000 nm, 3000 nm-5000 nm, or 4000 nm-5000 nm.

Figure 3K:
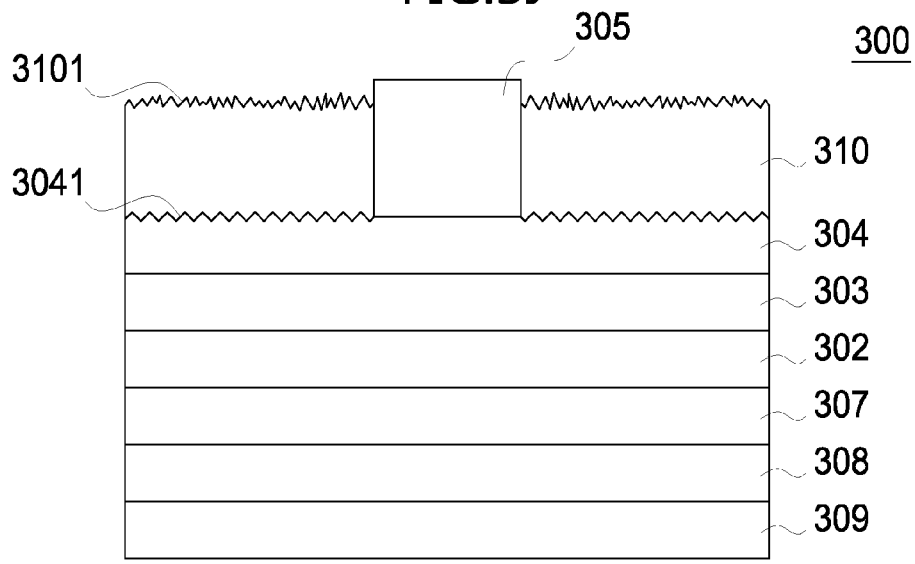

As FIG. 3K shows, a wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture is performed on the upper surface of the passivation layer 3101 to enhance the second texture profile, such as to increase the density and/or depth of the second texture profile.

However, the shape, density and/or depth are adjustable by the conditions for formation. The second texture profile is adjustable by the etching conditions, and can form various types such as circle, hexagon, dodecagon, conical, or pyramidal shapes. For example, the depth of the second texture profile can be 200 nm-3000 nm, 500 nm-3000 nm, 1000 nm-3000 nm, 1500 nm-3000 nm, or 2000 nm-3000 nm.

After the enhancement, the second texture profile is different from the first texture profile. The average depth of the second texture profile is larger than the average depth of the first texture profile. In other words, the second texture profile is a more rugged surface for outputting lights, and the actual critical angle is expanded which improves the luminous outputting efficiency. With the difference of the texture profile, the light extraction efficiency is further increased.

In this embodiment, the refraction index of the passivation layer 310 and the second conductive-type semiconductor layer 304 is different. The first refractive index ($n_1$) of the passivation layer 310 is smaller than the second refractive index ($n_2$) of the second conductive-type semiconductor layer 304. With the difference of the refractive index, the reflection of the light and the refraction in the optoelectronic device can be decreased, and the optical confinement and absorption in the optoelectronic device can also be decreased, so as to increase the light extraction efficiency. In one embodiment, the first refractive index ($n_1$) of the passivation layer 310 can be $2.4>n_1 \geq 1.9$, and the second refractive index ($n_2$) of the second conductive-type semiconductor layer 304 can be $3.3 \geq n_2 \geq 2.4$.

Figure 3L:
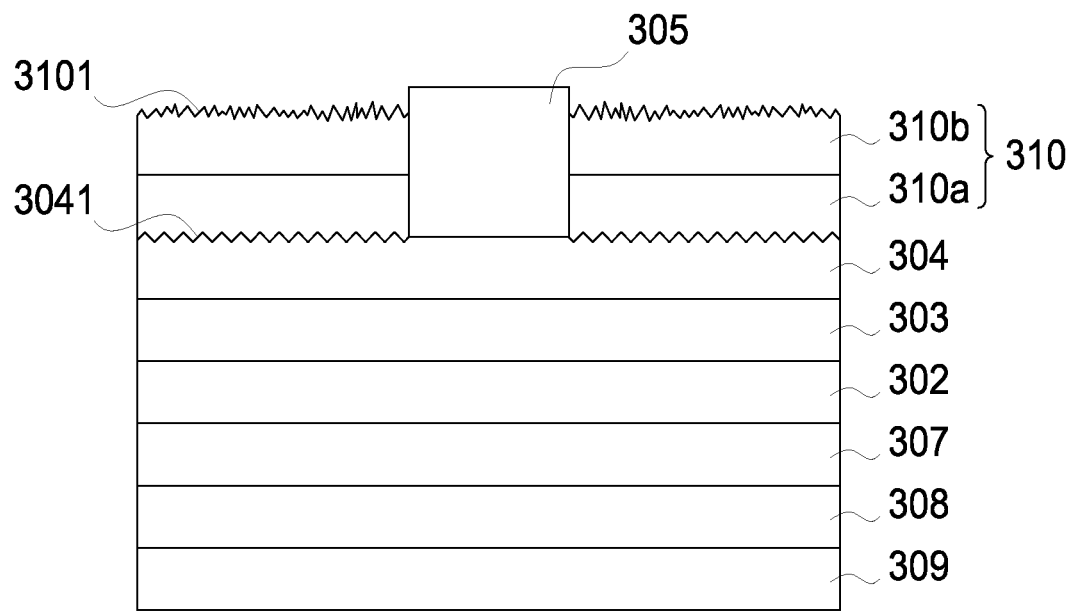
Figure 3M:
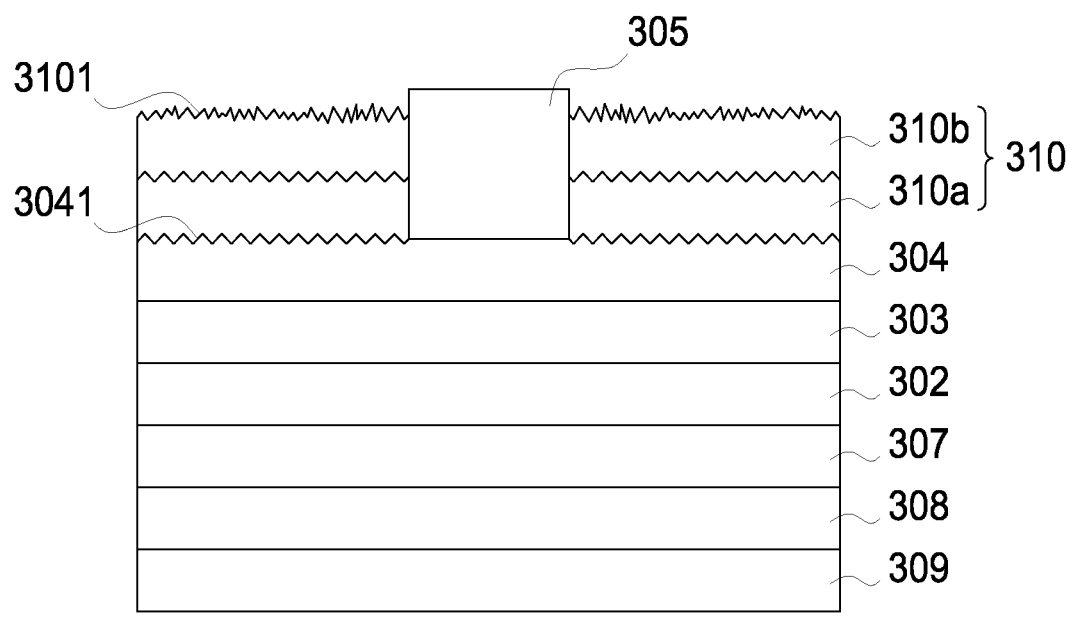

As shows in FIG. 3L, in another embodiment, the passivation layer 310 can be a multilayer structure with different material including a first sub layer 310a formed on the upper surface of the second conductive-type semiconductor layer 304 with a textured upper surface having a third refractive index ($n_3$) and a second sub layer 310b formed on the first sub layer 310a having a fourth refractive index ($n_4$). The third refractive index ($n_3$) of the first sub layer 310a of the passivation layer 310 can be $2.4>n_3 \geq 1.9$, the fourth refractive index ($n_4$) of the second sub layer 310b of the passivation layer 310 can be smaller than or equal to 1.9, and the second refractive index ($n_2$) of the second conductive-type semiconductor layer 304 can be $3.3 \geq n_2 \geq 2.4$. As shows in FIG. 3L, in another embodiment, the upper surface of the second sub layer 310b of the passivation layer 310 can also be a textured surface.

FIGS. 4A to 4H illustrate a process flow of the method of fabricating the optoelectronic device of a second embodiment of the present disclosure. Some fabricating methods in the second embodiment are same with those in the first embodiment; please refer to the first embodiment for the same beginning process.

Figure 4A:
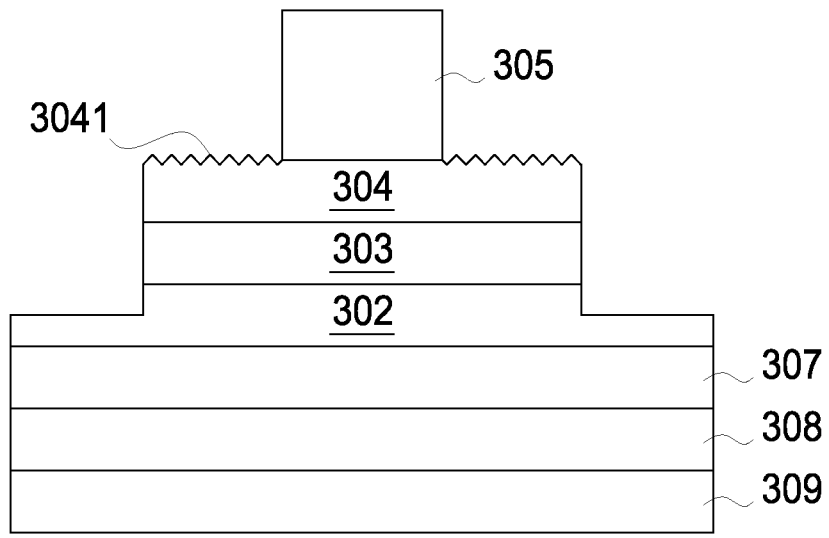
FIGS. 4A to 4H illustrate a process flow of another method of fabricating an optoelectronic device in the present disclosure.

Following the process of FIG. 3I, FIG. 4A illustrates a further step by employing photolithography and etching process to etch the semiconductor epitaxial layer in order to expose a portion of the first conductive-type semiconductor layer 302. In another embodiment, this process can be performed after the process shown in FIG. 3K.

Figure 4B:
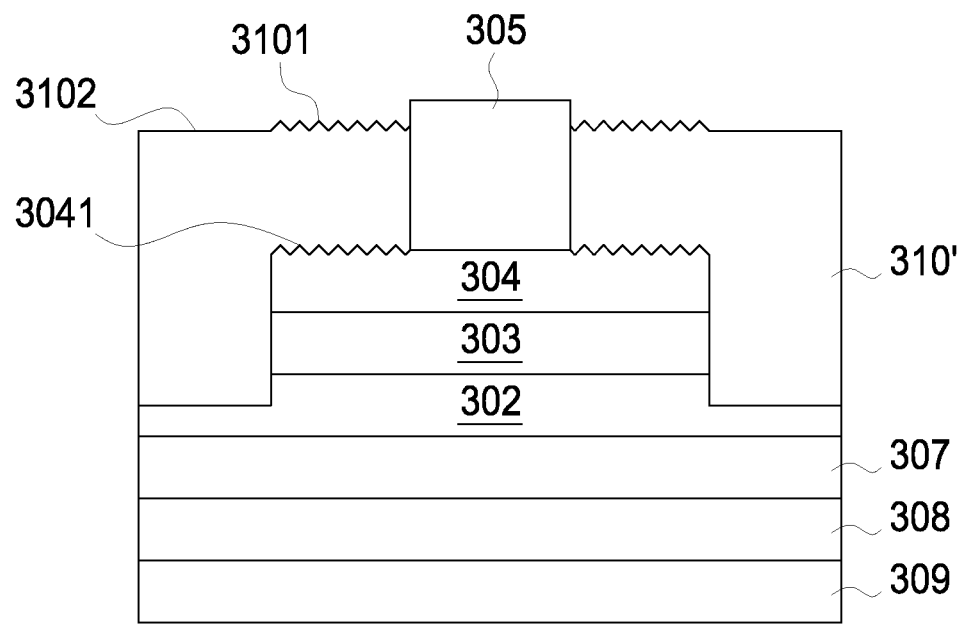

As FIG. 4B shows, a passivation layer 310' is formed on the top surface of the second conductive-type semiconductor layer 3041, wherein the passivation layer 310' may be formed simultaneously on the top of the exposed first conductive-type semiconductor layer 302 and covering the sidewall of the semiconductor epitaxial layer. The material of the passivation layer 310 can be $SiO_2$, $TiO_2$, $Ta_2O_5$ or $SiN_x$, and the thickness of the passivation layer 310 can be 200 nm-5000 nm, 500 nm-5000 nm, 1000 nm-5000 nm, 2000 nm-5000 nm, 3000 nm-5000 nm, or 4000 nm-5000 nm.

The upper surface of the passivation layer 310' can be divided into a first region and a second region, wherein the first region is formed on the upper surface of the second conductive-type semiconductor layer 3041 with a second texture profile wherein the second texture profile is substantially the same with the first texture profile; and the second region 3102 is formed on the exposed first conductive-type semiconductor layer 302 having a substantially flat upper surface.

Figure 4C:
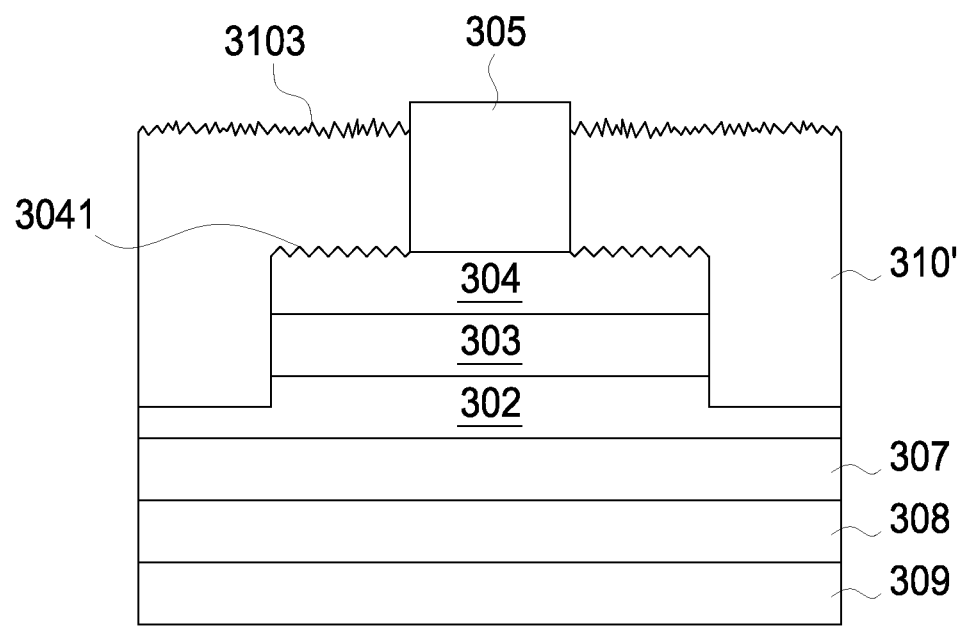

As FIG. 4C shows, a wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture is performed on the upper surface of the passivation layer 310' to form a third texture profile on the second region 3102 and enhance the second texture profile in the first region 3101, such as to increase the density and/or depth of the second texture profile, wherein the third texture profile is substantially covering the first region 3101 and the second region 3102.

Figure 4D:
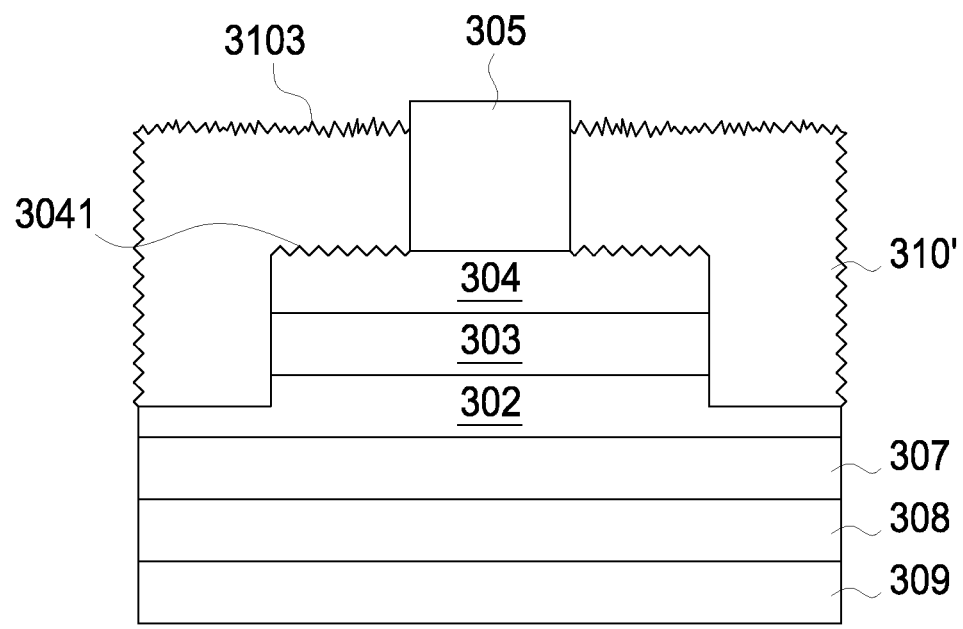

In another embodiment, as shows in FIG. 4D, the sidewall of the passivation layer 310' can also be performed by a wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture to form the third texture profile.

However, the shape, density and/or depth of the third texture profile 3103 are adjustable with the conditions for formation. The shape of the third texture profile is adjustable by the etching conditions, and can form various types such as circle, hexagon, dodecagon, conical, or pyramidal shapes. The depth of the third texture profile can be 200 nm-3000 nm, 500 nm-3000 nm, 1000 nm-3000 nm, 1500 nm-3000 nm, or 2000 nm-3000 nm.

After the enhancement, the third texture profile is different from the first texture profile. In other words, the third texture profile 3103 is a more rugged surface for outputting lights, and the actual critical angle is expanded which improves the luminous outputting efficiency. With the difference of the texture profile, the light extraction efficiency is further increased.

In this embodiment, the refraction index of the passivation layer 310 and the second conductive-type semiconductor layer 304 is different. The first refractive index ($n_1$) of the passivation layer 310 is smaller than the second refractive index ($n_2$) of the second conductive-type semiconductor layer 304. With the difference of the refractive index, the reflection of the light and the refraction in the optoelectronic device can be decreased and the optical confinement and absorption in the optoelectronic device can also be decreased, so as to increase the light extraction efficiency. In one embodiment, the first refractive index ($n_1$) of the passivation layer 310 can be $2.4 > n_1 \geq 1.9$, and the second refractive index ($n_2$) of the second conductive-type semiconductor layer 304 can be $3.3 \geq n_2 \geq 2.4$.

Figure 4E:
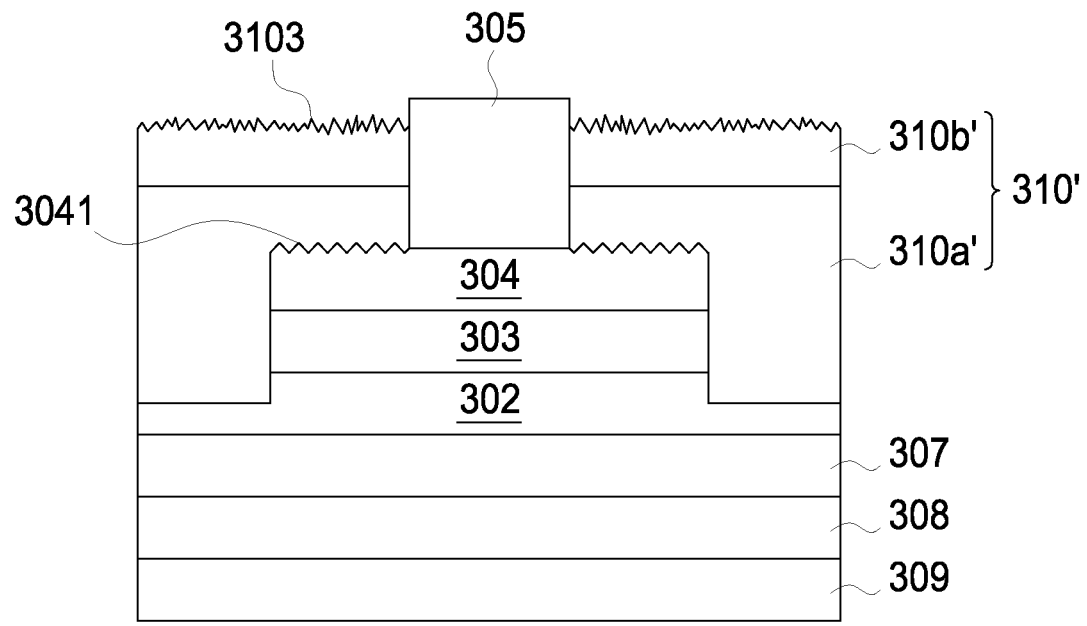

As shows in FIG. 4E, in another embodiment, the passivation layer 310' can be a multilayer structure with different material including a first sub layer 310a' formed on the top of the second conductive-type semiconductor layer 304 and on the top of the exposed first conductive-type semiconductor layer 302 with a textured upper surface having a third refractive index ($n_3$) and a second sub layer 310b' formed on the first sub layer 310a' having a fourth refractive index ($n_4$). The third refractive index ($n_3$) of the first sub layer 310a' of the passivation layer 310' can be $2.4 > n_3 \geq 1.9$, the fourth refractive index ($n_4$) of the second sub layer 310b' of the passivation layer 310' can be smaller than or equal to 1.9, and the second refractive index ($n_2$) of the second conductive-type semiconductor layer 304 can be $3.3 \geq n_2 \geq 2.4$.

Figure 4F:
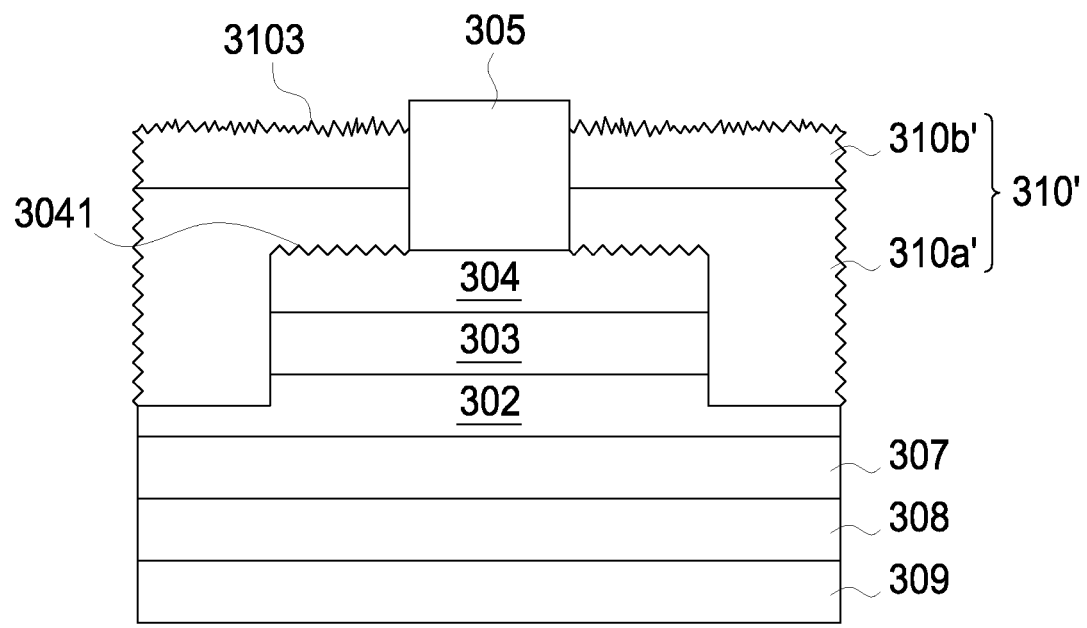

In another embodiment, as shown in FIG. 4F, the sidewall of the passivation layer 310' can also be roughened by wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture to form the third texture profile.

Figure 4G:
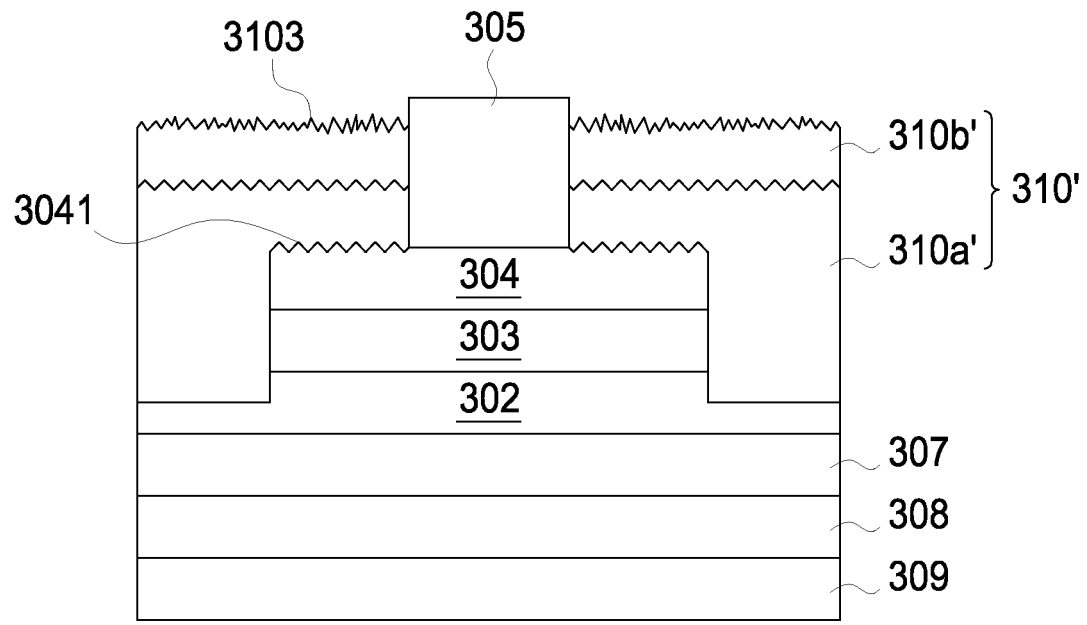

Following the process of FIG. 4E, as shows in FIG. 4G in another embodiment, the upper surface of the second sub layer 310b' of the passivation layer 310' can also be a textured surface.

Figure 4H:
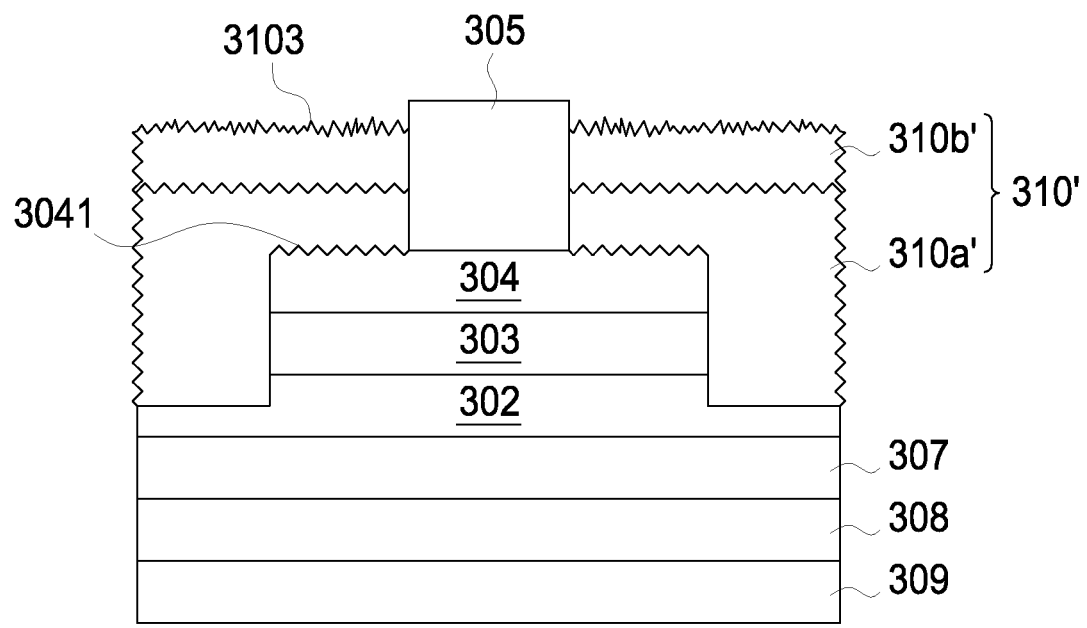

Following the process of FIG. 4F, As shows in FIG. 4H, in another embodiment, the upper surface of the second sub layer 310b' of the passivation layer 310' can also be a textured surface.

Figure 5A:
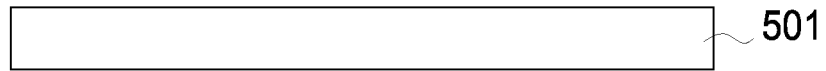
FIGS. 5A to 5I illustrate another process flow of another method of fabricating an optoelectronic device in the present disclosure.
Figure 5B:

FIGS. 5A to 5I illustrate a process flow of fabricating the optoelectronic device of a third embodiment of the present disclosure. FIGS. 5A-5B show that a first substrate 501 is provided and a plurality of semiconductor epitaxial layers is formed on the first substrate 501, wherein the semiconductor epitaxial layer includes, from the bottom, a first conductive-type semiconductor layer 502, an active layer 503, and a second conductive-type semiconductor layer 504.

Figure 5C:
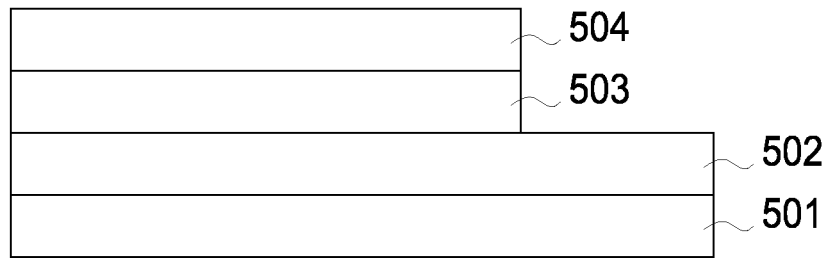

FIG. 5C shows performing a step by employing photolithography and etching process to etch the semiconductor epitaxial layer in order to expose a portion of the first conductive-type semiconductor layer 302.

Figure 5D:
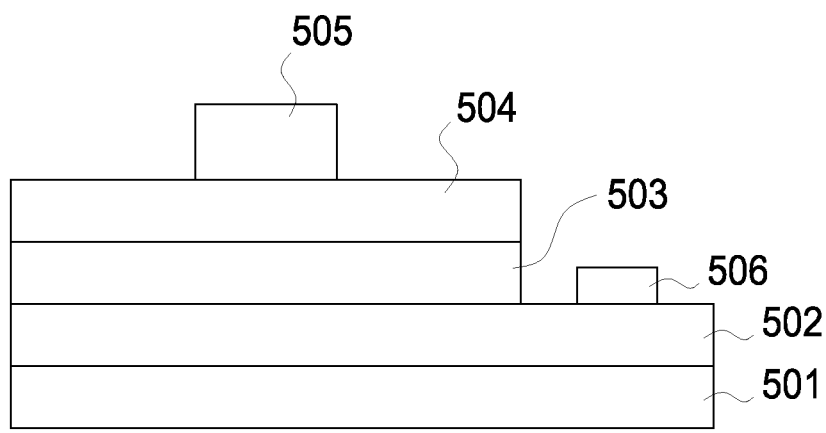

FIG. 5D shows forming at least one first electrode 505 on the upper surface of second conductive-type semiconductor layer 504 and forming at least one second electrode 306 on the exposed first conductive-type semiconductor layer 502.

In one embodiment, a transparent conductive layer (not shown) is formed on the upper surface of second conductive-type semiconductor layer 504 and the first electrode 505 is formed on the transparent conductive layer. The material of the transparent conductive layer comprises one or more materials selected from a group consisting of ITO, InO, SnO, CTO, ATO, AZO, and ZnO.

Figure 5E:
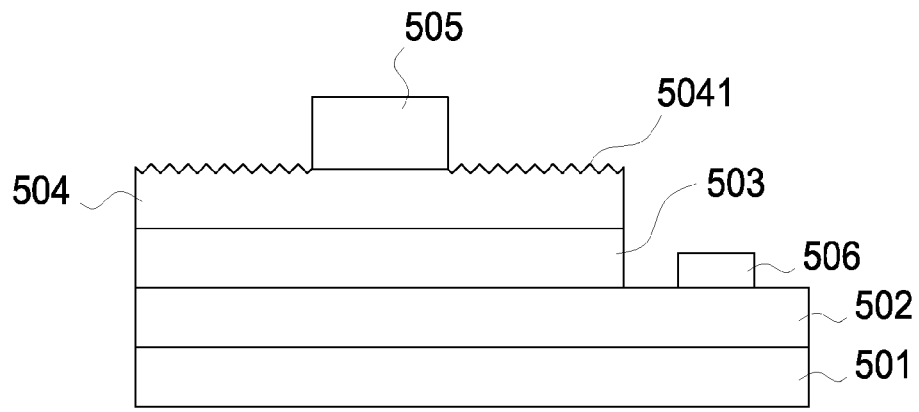

FIG. 5E shows etching the upper surface of the second conductive-type semiconductor layer 5041 by the following method to form at least one first texture profile such as pore, void, pinhole, cavity or porous structure on the upper surface of the second conductive-type semiconductor layer 5041.

The methods include: 1) Wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture;

2) Electrochemical etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture; or 3) Dry etching such as inductive coupling plasma (ICP), reactive ion etch (RIE) by a gas containing at least one of HCl, $Cl_2$, $SF_6$, $BCl_3$ and $CH_4$.

However, the shape, density and/or depth of the first texture profile are adjustable by the method and conditions for formation. The shape of the first texture profile is adjustable by the etching conditions, and can form various types such as circle, hexagon, dodecagon, conical, or pyramidal shapes. For example, the depth of the first texture profile can be 200 nm-3000 nm, 500 nm-3000 nm, 1000 nm-3000 nm, 1500 nm-3000 nm, or 2000 nm-3000 nm.

Figure 5F:
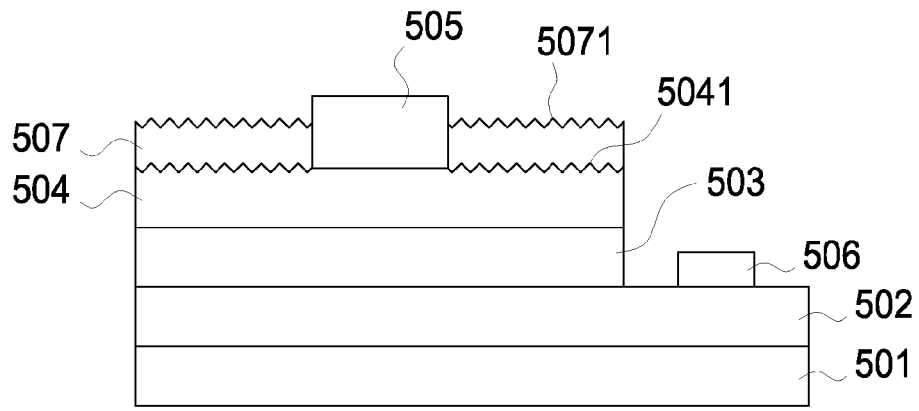

Following, as FIG. 5F shows, a passivation layer 507 is formed on the upper surface of the second conductive-type semiconductor layer 5041 and at least a second texture profile 5071 is formed on the upper surface of the passivation layer 507 wherein the second texture profile is substantially the same as the first texture profile. The material of the passivation layer 507 can be $SiO_2$, $TiO_2$, $Ta_2O_5$, or $SiN_x$, and the thickness of the passivation layer 507 can be 200 nm-5000 nm, 500 nm-5000 nm, 1000 nm-5000 nm, 2000 nm-5000 nm, 3000 nm-5000 nm, or 4000 nm-5000 nm.

Figure 5G:
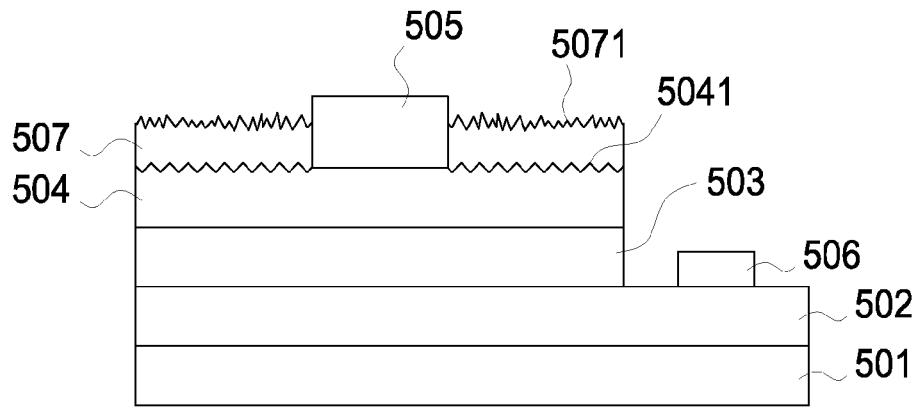

As FIG. 5G shows, a wet etching with an aqueous solution of at least one of $H_2SO_4$, $H_3PO_4$, $H_2C_2O_4$, HCl, KOH, NaOH, Buffered Oxide Etch (BOE) solution, ethylene glycol solution or their mixture is performed on the upper surface of the passivation layer 507 to enhance the second texture profile, such as to increase the density and/or depth of the second texture profile. However, the shape, density and/or depth thereof are adjustable by the conditions for formation. For example, the depth of the second texture profile can be 200 nm-3000 nm, 500 nm-3000 nm, 1000 nm-3000 nm, 1500 nm-3000 nm, or 2000 nm-3000 nm. After the enhancement, the second texture profile 5071 is different from the first texture profile 5041. And the average depth of the second texture profile is larger than the average depth of the first texture profile. In other words, the second texture profile 5071 is a more rugged surface for outputting lights, and the actual critical angle is expanded which improves the luminous outputting efficiency. With the difference of the texture profile, the light extraction efficiency is further increased.

In this embodiment, the refraction index of the passivation layer 507 and the second conductive-type semiconductor layer 504 is different. The first refractive index ($n_1$) of the passivation layer 507 is smaller than the second refractive index ($n_2$) of the second conductive-type semiconductor layer 504. With the difference of the refractive index, the reflection of the light and the refraction in the optoelectronic device can be decreased, and the optical confinement and absorption in the optoelectronic device can also be decreased, so as to increase the light extraction efficiency. In one embodiment, the first refractive index ($n_1$) of the passivation layer 507 can be $2.4 > n_1 \geq 1.9$, and the second refractive index ($n_2$) of the second conductive-type semiconductor layer 504 can be $3.3 \geq n_2 \geq 2.4$.

Figure 5H:
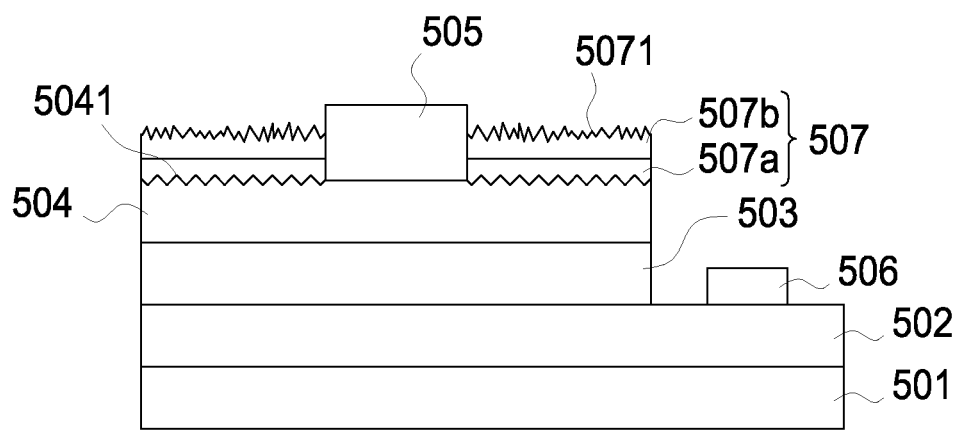
Figure 5I:
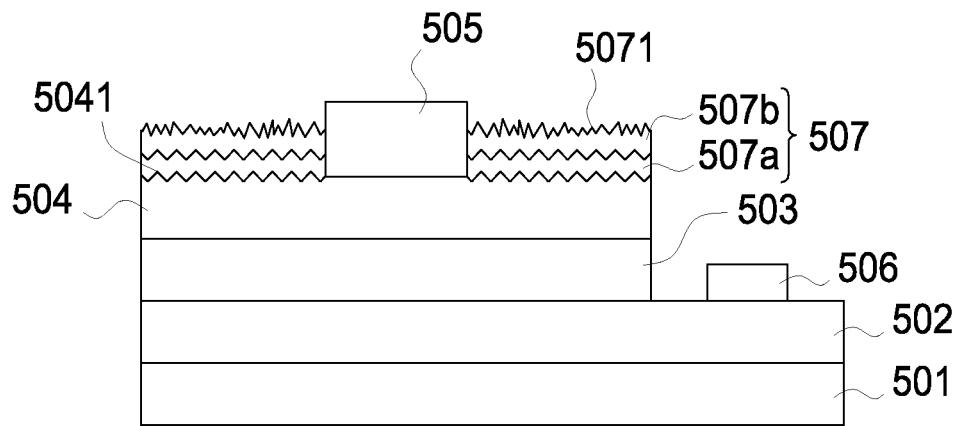

As shown in FIG. 5H, in another embodiment, the passivation layer 507 can be a multilayer structure with different material including a first sub layer 507a formed on the upper surface of the second conductive-type semiconductor layer 504 with a textured upper surface having a third refractive index ($n_3$) and a second sub layer 507b formed on the first sub layer 507a having a fourth refractive index ($n_4$). The third refractive index ($n_3$) of the first sub layer 507a of the passivation layer 507 can be $2.4 > n_3 \geq 1.9$, the fourth refractive index ($n_4$) of the second sub layer 507b of the passivation layer 507 can be smaller than or equal to 1.9, and the second refractive index ($n_2$) of the second conductive-type semiconductor layer 504 can be $3.3 \geq n_2 \geq 2.4$. As shown in FIG. 5I, in another embodiment, the upper surface of the second sub layer 507b of the passivation layer 507 can also be a textured surface.

Figure 6A:
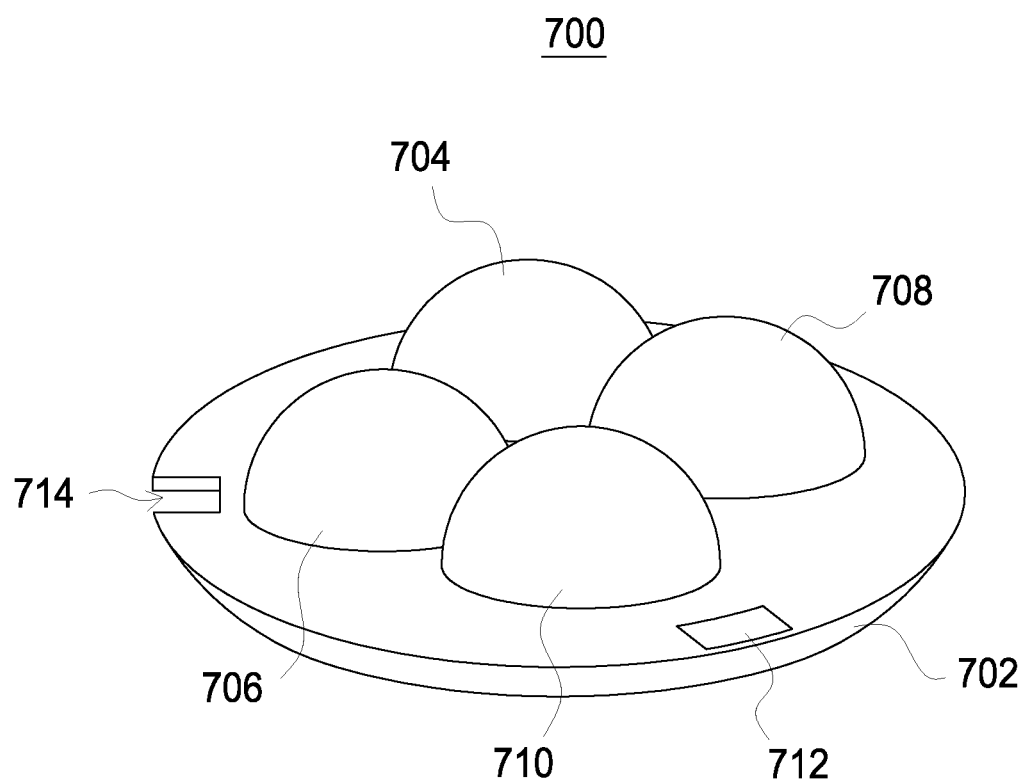
FIGS. 6A-6C illustrates an optoelectronic device module of an embodiment in the present disclosure.
Figure 6B:
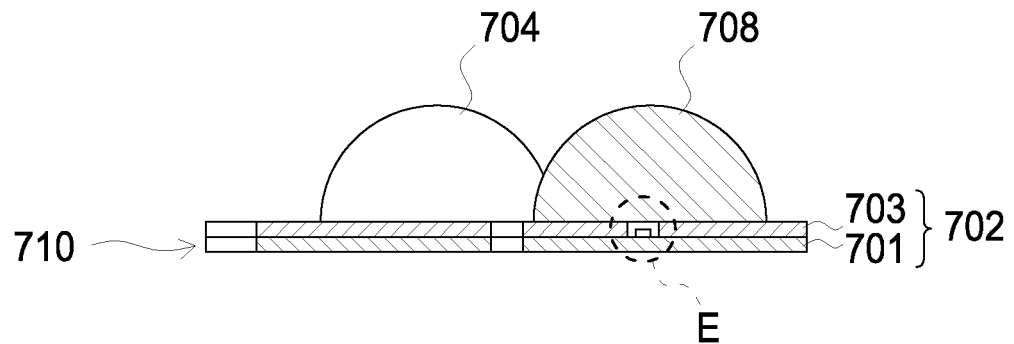
Figure 6C:
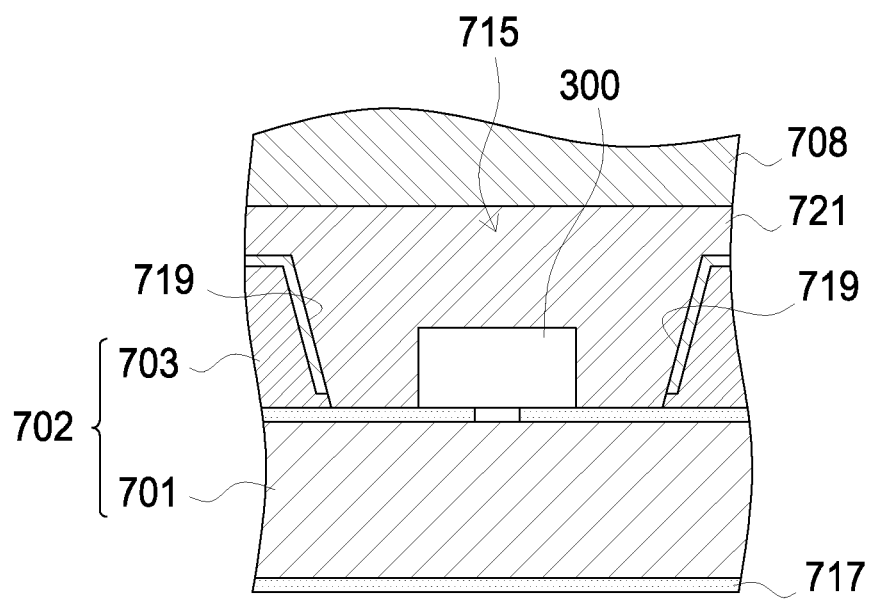

FIGS. 6A-6C illustrates an optoelectronic device module of an application in the present disclosure. FIG. 6A is an external perspective view illustrating an optoelectronic device module 700 including a submount 702, an optoelectronic device (not shown) described above, a plurality of lens 704, 706, 708, 710, and two power supply terminals 712, 714. The LED module 700 is attached to a lighting unit 800 (mentioned later).

FIG. 6B is a plan view illustrating the optoelectronic device module 700, and FIG. 6C is an enlargement view illustrating a portion E shown in FIG. 6B. As FIG. 6B shows, the substrate 702 including an upper subunit 703 and a lower subunit 701, and at least one surface of the lower subunit 701 is contacted with the upper subunit 703. The lens 704, 708 is formed on the upper subunit 703. At least one through hole 715 is formed on the upper subunit 703 and at least one of the optoelectronic device 300 is formed inside the through hole 715 and contacted with the lower subunit 701. Besides, the optoelectronic device 300 is encapsulated by an adhesive agent 721 and forming a lens 708 on the adhesive agent 721 wherein the material of the adhesive agent 721 may be a silicone resin, an epoxy resin or the like. In one embodiment, a reflecting layer 719 is formed on the sidewall of the through hole 715 to increase the light emitting efficiency. A metal layer 717 can be formed on the lower surface of the lower subunit 701 for improving heat dissipation.

Figure 7A:
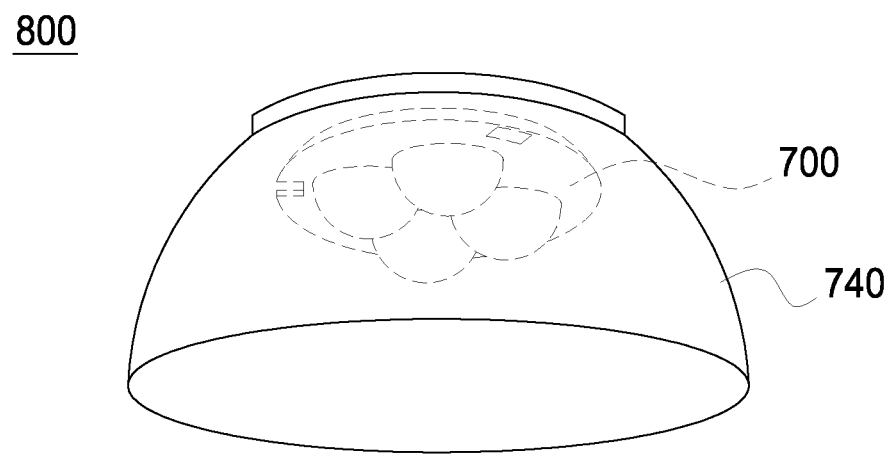
FIGS. 7A-7B illustrates a lighting apparatus of an embodiment in the present disclosure.
Figure 7B:
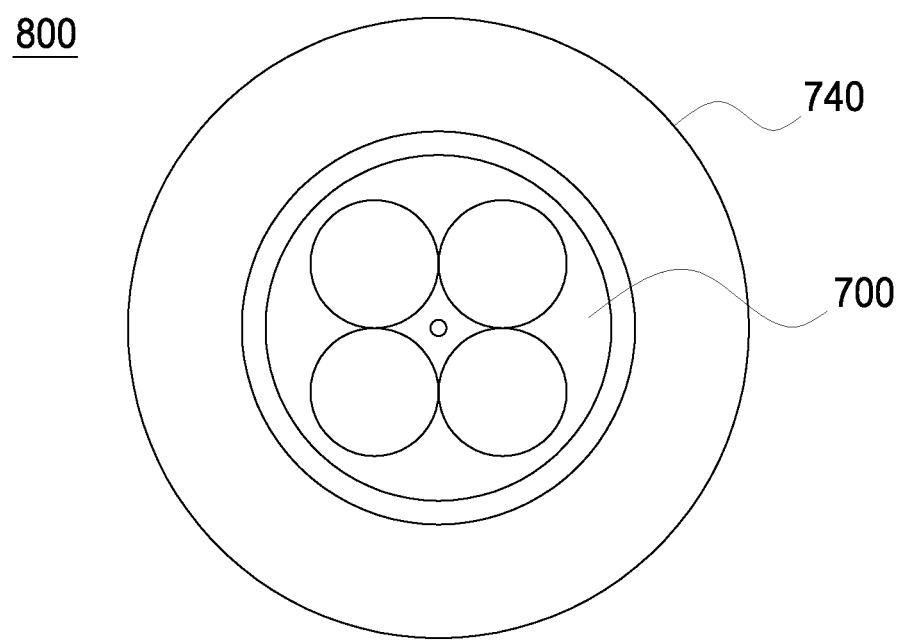

FIGS. 7A-7B illustrates a lighting apparatus of an embodiment in the present disclosure. The lighting apparatus 800 includes an optoelectronic device module 700, a lighting unit 740, a power supply circuit (not shown) to supply current to the lighting apparatus 800 and a control unit (not shown) to control the power supply circuit. The lighting apparatus 800 can be an illumination device, such as street lamps, headlights or indoor illumination light source, and can be a traffic sign or a backlight module of the display panel.

FIG. 8 shows an explosive diagram of a bulb in accordance with another application of the present application. The bulb 900 comprises a cover 821, a lens 822, a lighting module 824, a lamp holder 825, a heat sink 826, a connecting part 827, and an electrical connector 828. The lighting module 824 comprises a carrier 823 and a plurality of optoelectronic device 300 of any one of the above mentioned embodiments on the carrier 823.

The first electrode 305, 505, the second electrode 307, 506, can be made of metal material such as Cr, Ti, Ni, Pt, Cu, Au, Al, W, Sn, Ag, or the combination thereof.

Specifically, the optoelectronic device comprises light-emitting diode (LED), photodiode, photo resister, laser diode, infrared emitter, organic light-emitting diode and solar cell. The substrate 301, 309, 501 can be a growing or carrying base. The material of the substrate 301, 309, 501 comprises an electrically conductive substrate, electrically insulating substrate, transparent substrate, or opaque substrate. The material of the electrically conductive substrate can be metal such as Ge and GaAs, oxide such as $LiAlO_2$ and ZnO, nitrogen compound such as GaN and AlN, phosphide such as InP, silicon compound such as SiC, or Si. The material of the transparent substrate can be chosen from sapphire ($Al_2O_3$), $LiAlO_2$, ZnO, GaN, AlN, glass, diamond, CVD diamond, diamond-like carbon (DLC), spinel ($MgAl_2O_3$), $SiO_x$, or $LiGaO_2$.

The first semiconductor layer 302, 502 and the second semiconductor layer 304, 504 are different in electricity, polarity or dopant, or are the different semiconductor materials used for providing electrons and holes, wherein the semiconductor material can be single semiconductor material layer or multiple semiconductor material layers. The polarity can be chosen from any two of p-type, n-type and i-type. The active layer 303, 503 is disposed between the first semiconductor layer 302, 502 and the second semiconductor layer 304, 504 respectively where the electrical energy and the light energy can be converted or stimulated converted. The devices which can convert or stimulated convert the electrical energy into the light energy are like light-emitting diode, liquid crystal display, and organic light-emitting diode. The devices which can convert or stimulated convert the light energy into the electrical energy are like solar cell and optoelectronic diode. The material of the first semiconductor layer 302, 502 the active layer 303, 503 and the second semiconductor layer 304, 504 comprises Ga, Al, In, As, P, N, Si, and the combination thereof.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from Al, Ga, In, P, N, Zn, O, or the combination thereof. The structure of the active layer (not shown) can be single heterostructure (SH), double heterostructure (DH), double-side double heterostructure (DDH) or multi-quantum well (MQW), wherein the wavelength of the light emitted from the active layer (not shown) can be changed by adjusting the number of the pairs of MQW.

In one embodiment of the application, a buffer layer (not shown) can be selectively disposed between the first semiconductor layer 302, 502 and the substrate 301, 501. The buffer layer is between the two material systems to transit the material system of the substrate 301, 501 to the material system of the first semiconductor layer 302, 502. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AlN or GaN, and the buffer layer can be formed by sputtering or atomic layer deposition (ALD).

A contacting layer (not shown) can be selectively formed on the second semiconductor layer 304, 504. The contacting layer is disposed on the side of the second semiconductor layer 304, 504 away from the active layer 303, 503. Specifically, the contacting layer can be optical layer, electrical layer, or the combination thereof. The optical layer can change the radiation or the light from or entering the active layer 303, 503, wherein the optical layer can change but not limited to the frequency, the wavelength, the intensity, the flux, the efficiency, the color temperature, rendering index, light field, angle of view. The electrical layer can change the value, density, distribution of voltage, resistor, current and capacitance of any two relative sides of the contacting layer. The material of the contacting layer comprises oxide such as conductive oxide, transparent oxide and the oxide with the transparency over 50%, metal such as transparent metal and the metal with transparency over 50%, organic material, inorganic material, fluoresce material, ceramic, semiconductor material and doping semiconductor material. In some applications, the material of the contacting layer can be selected from InTiO, CdSnO, SbSnO, InZnO, ZnAlO or ZnSnO. If the material of the contacting layer is transparent metal, the thickness of the contacting layer is in a range of 0.005 µm~0.6 µm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device comprising:
a first substrate;
an epitaxial stack formed on the first substrate wherein the epitaxial stack comprising a first conductive-type semiconductor layer, an active layer and a second conductive-type semiconductor layer wherein the upper surface of the second conductive-type semiconductor layer comprising a flat region and a first texture region comprising a first texture profile;
a first electrode formed directly on the flat region; and
a first passivation layer formed on the upper surface of the second conductive-type semiconductor layer,
wherein the upper surface of the first passivation layer comprises a second texture profile not corresponding to, random and different from the first texture profile, and
wherein an average depth of the second texture profile is larger than an average depth of the first texture profile.

2. The optoelectronic device of claim 1, wherein the material of the epitaxial stack contains one element selected from the group consisting of Al, Ga, In, As, P, and N.

3. The optoelectronic device of claim 1, wherein the depth of the first texture profile can be 10 nm-5000 nm.

4. The optoelectronic device of claim 1, wherein the depth of the second texture profile can be 10 nm-5000 nm.

5. The optoelectronic device of claim 1, wherein a first refractive index ($n_1$) of the first passivation layer is smaller than a second refractive index ($n_2$) of the second conductive-type semiconductor layer.

6. The optoelectronic device of claim 5, wherein the first refractive index ($n_1$) of the first passivation layer can be $2.4 > n_1 \geq 1.9$, and the second refractive index ($n_2$) of the second conductive-type semiconductor layer can be $3.3 \geq n_2 \geq 2.4$.

7. The optoelectronic device of claim 5, further comprising a second passivation layer formed on the first passivation layer, wherein the second passivation layer comprises a third textured profile and a third refractive index (n3), and the third refractive index (n3) is smaller than first refractive index (n1).

8. The optoelectronic device of claim 1, wherein the first textured profile comprises pores, voids, pinholes, cavities or porous structure.

9. The optoelectronic device of claim 1, wherein the first textured profile has a form of circles, hexagons, dodecagons, conical or pyramidal shapes.

10. The optoelectronic device of claim 1, wherein the second textured profile comprises circles, hexagons, dodecagons, cones, or pyramids and with an average depth of the second profile being larger than the average depth of the first profile to increase the critical angle.

11. The optoelectronic device of claim 1, wherein a second electrode is formed on the first conductive-type semiconductor layer and said second electrode is covered with an adhesive layer.

12. The optoelectronic device of claim 1, wherein the first passivation layer is directly formed on the second conductive-type semiconductor layer.

13. The optoelectronic device of claim 1, wherein the first texture region surrounds the flat region.

14. The optoelectronic device of claim 1, wherein the first passivation layer contacts a side surface of the first electrode.

15. The optoelectronic device of claim 1, further comprising a second passivation layer formed on the first passivation layer,
wherein an upper surface of the second passivation layer comprises a third texture profile not corresponding to, random and different from the first texture profile and the second texture profile.

16. The optoelectronic device of claim 15, wherein the second passivation layer contacts a side surface of the first electrode.

17. The optoelectronic device of claim 15, wherein the third texture profile surrounds the first electrode.

18. An optoelectronic device comprising:
a first substrate;
an epitaxial stack formed on the first substrate wherein the epitaxial stack comprises a first conductive-type semiconductor layer, an active layer and a second conductive-type semiconductor layer wherein the upper surface of the second conductive-type semiconductor layer comprises a flat region and a first texture region comprising a first texture profile;
a first electrode formed directly on the flat region; and
a first passivation layer formed on and contiguous with the first texture region,
wherein the upper surface of the first passivation layer comprises a second texture profile, random and different from the first texture profile, and
wherein an average depth of the second texture profile is larger than an e depth of the first texture profile.

19. The optoelectronic device of claim 18, wherein the first passivation layer is directly formed on the second conductive-type semiconductor layer.

20. The optoelectronic device of claim 18, wherein a second electrode is formed on the first conductive-type semiconductor layer and said second electrode is covered with an adhesive layer.

21. The optoelectronic device of claim 18, further comprising a second passivation layer formed on the first passivation layer,
wherein an upper surface of the second passivation layer comprises a third texture profile not corresponding to, random and different from the first texture profile and the second texture profile.

22. The optoelectronic device of claim 21, wherein the second passivation layer contacts a side surface of the first electrode.

23. The optoelectronic device of claim 21, wherein the third texture profile surrounds the first electrode.

* * * * *